United States Patent [19]

Glover et al.

[11] Patent Number: 4,591,789

[45] Date of Patent: May 27, 1986

[54] METHOD FOR CORRECTING IMAGE DISTORTION DUE TO GRADIENT NONUNIFORMITY

[75] Inventors: Gary H. Glover, Waukesha; Norbert J. Pelc, Wauwatosa, both of Wis.

[73] Assignee: General Electric Company, Milwaukee, Wis.

[21] Appl. No.: 565,256

[22] Filed: Dec. 23, 1983

[51] Int. Cl.[4] ............................................. G01R 33/20
[52] U.S. Cl. ................................ 324/307; 324/309; 324/313
[58] Field of Search ............... 358/111, 139; 324/300, 324/307, 309, 313; 128/653; 378/99

[56] References Cited

U.S. PATENT DOCUMENTS

| 4,296,378 | 10/1981 | King | 324/313 |
| 4,355,282 | 10/1982 | Young | 324/309 |
| 4,425,580 | 1/1984 | Haendle | 128/653 |

Primary Examiner—Michael J. Tokar
Attorney, Agent, or Firm—Alexander M. Gerasimow; Douglas E. Stoner

[57] ABSTRACT

A method for correcting image distortion arising from magnetic field gradient nonuniformity in accordance with which the gradient nonuniformity is modeled, the expected distortion in the image calculated, and a geometric correction applied to the distorted image. In the preferred embodiment, polynomial interpolation is used to implement the geometric correction.

13 Claims, 3 Drawing Figures

METHOD FOR CORRECTING IMAGE DISTORTION DUE TO GRADIENT NONUNIFORMITY

BACKGROUND OF THE INVENTION

This invention relates to nuclear magnetic resonance (NMR) techniques. In particular, this invention relates to a method for correcting distortions in NMR images due to nonuniformity of magnetic field gradients.

NMR has been developed into an imaging modality utilized to obtain images of internal anatomical features of humans, for example. Such images depicting tissue-related parameters, such as nuclear spin distribution, spin-lattice ($T_1$), and/or spin-spin ($T_2$) relaxation constants are believed to be of medical diagnostic value in determining the state of health of tissue in the region examined. In the course of an examination, the patient region of interest is positioned in a substantially uniform polarizing magnetic field produced by one of known means, such as resistive, superconductive, or permanent magnets. Imaging data for reconstructing NMR images is collected by subjecting the region to pulse sequences comprised of magnetic field gradient and RF pulses. The magnetic gradient field and radio-frequency fields are generated by coil assemblies positioned in the polarizing magnetic field and have a generally cylindrical configuration to accommodate the patient region to be studied.

Magnetic field gradients are used in combination with the RF pulses to encode spatial information into NMR signals emanating from the region being examined. Typically, three magnetic field gradients are used, each producing a field whose component parallel to the polarizing magnetic field exhibits a variation with the X, Y, or Z position within a Cartesian coordinate system. The gradients are required to be substantially constant throughout the region of interest, although their magnitudes are typically time dependent. Non-uniform magnetic field gradients in the region to be imaged result in a non-linearity in the space-frequency relationship that exists in the region subjected to a magnetic field gradient. The relationship between field strength and resonant frequency is defined by the well-known Larmor equation, in accordance with which the nuclear spin resonant frequency $\omega$ is proportional to the applied magnetic field. The resonant frequency for different NMR isotopes is defined by means of a constant known as the gyromagnetic ratio. The linear relationship between field strength and resonant frequency forms the basis of NMR imaging.

Aberrations in the gradient uniformity cause geometric distortion of the image. In one specific example of an NMR imaging technique known as spin-warp imaging (which is a specific example of the Fourier transform NMR technique), the distortions are most apparent near the edges of the field of view, due to the reduction in the gradient strengths there. One solution to the image distortion problem, regardless of which NMR imaging technique is utilized, is to construct the gradient coils large enough relative to the field of view so that the central region has sufficient uniformity for the desired geometric fidelity. One penalty for this approach, however, is that the bore of not only the gradient coils but also of the main magnet producing a polarizing magnetic field must be increased. However the bore diameter can only be increased at great expense, particularly in superconductive magnets which are frequently utilized in NMR imaging. A second penalty is that the power required to drive the gradient coils increases as diameter to the fifth power. Thus, increasing the diameter in order to expand the uniform volume is not an attractive solution. A second approach is to make the gradient coils with higher order correction current distributions in order to increase the useful radius. This solution, however, also requires increased gradient drive power due to additional coil inductance, and entails considerable complication in the coil construction. It is, therefore, a principal object of the present invention to provide a method to render the current gradient coils more suitable for use in NMR imaging.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

SUMMARY OF THE INVENTION

In accordance with the invention a method is provided for correcting distortion in an NMR image composed of a multi-dimensional array of pixel elements. The distortion arises from magnetic field gradient nonuniformity in at least one dimension of the array. The distortion is manifested by displacement of the pixel elements relative to the desired positions thereof by an amount related to the degree of gradient nonuniformity. The correction is achieved by defining the expected degree of pixel displacement due to magnetic field nonuniformity in at least one dimension of the pixel array and applying a geometric correction to the displaced pixel elements as determined by the expected degree of displacement. In this manner, pixel displacement from the desired position is minimized in a corrected image.

DESCRIPTION OF THE PREFERRED EMBODIMENT

Figure 1:
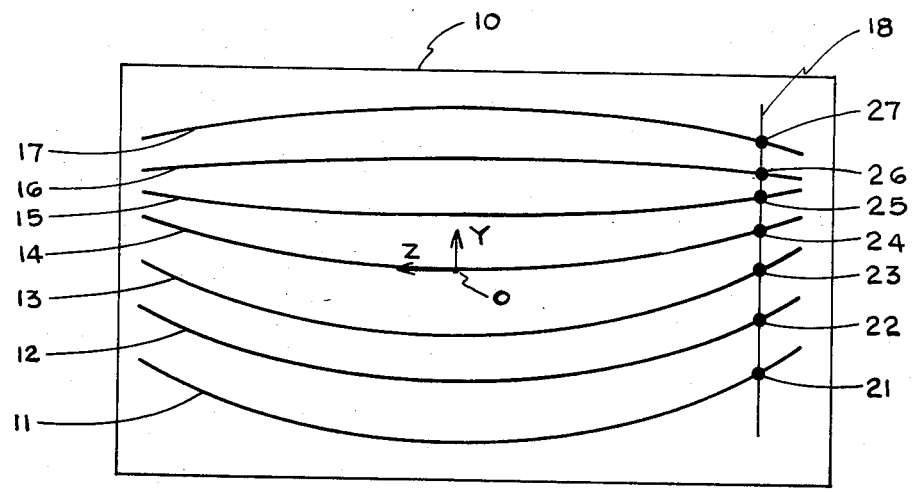
FIG. 1 illustrates graphically a geometrically distorted image of an NMR phantom made up of a number of parallel, water-filled tubes.

FIG. 1 is a graphic representation of a geometrically distorted image, lying within a field of view 10, reconstructed from data acquired using the two-dimensional spin-warp technique. The image is of an NMR phantom made up of a plurality of parallel, water-filled tubes 11–17. The phantom is centered at the system isocenter O, such that the tubes are parallel to the Z axis of the Cartesian coordinate system. The Z-axis direction is, typically, also the direction of the polarizing magnetic field $B_o$, as well as the direction in which the $G_z$ magnetic field gradient is applied. The $G_x$ and $G_y$ magnetic field gradients are applied in the X- and Y-axis directions, respectively. The system isocenter is taken to be the point at which the z components of the $G_x$, $G_y$, and $G_z$ gradient fields are equal to zero. The isocenter is also commonly congruent with the center of the homogeneous region of the polarizing field. In FIG. 1, the phantom is disposed in the Y-Z plane.

Water-filled tubes 11–17 appear distorted due to inhomogeneity of the $G_y$ magnetic field gradient. In this case, the variation with y is z dependent. The distortion is particularly accentuated near the edges of the field of view z where, in this case, the Y-gradient intensity decreases and higher-order terms defining the field become significant. The resulting image is minified near the field-of-view edges so that the tubes (which are in reality parallel) appear to curve inwardly toward the centrally located tube 14. In this case, the distortion is most evident in a full field-of-view sagittal (Y-Z) plane image. A coronal (X-Z) plane image would best display the distortions due to inhomogeneity of the $G_x$ gradient. The minification in such cases is most apparent in a direction transverse to the direction of the Z axis but is also extant in the direction of the Z axis. In a whole-body NMR imaging system utilizing a 1.5 Tesla superconductive magnet, the full field of view is approximately 50 cm. in diameter.

In accordance with the invention, the image distortion arising from gradient nonuniformity is corrected by determining a model of the gradient field nonuniformity, calculating the expected distortion in the image and applying a geometric correction to the imperfect image. The correction comprises displacing the space relationship of the pixels in the distorted image. This produces a corrected image which is a stretched or warped version of the original image.

In general, each of the magnetic field gradients can be modeled by $$G'_\alpha(x,y,z) = G_\alpha(0,0,0)[1 - \epsilon_\alpha(x,y,z)] \tag{1}$$

in which $\alpha$ is one of x, y, and z,
$G'_\alpha(x,y,z)$ is the actual (uncorrected) gradient,
$G_\alpha(0,0,0)$ is the gradient at the isocenter,
$\epsilon_\alpha(x,y,z)$ is the error term by which the gradient at (x,y,z) departs from the gradient at the isocenter.

The actual gradient $F_\alpha$ can be expressed in normalized units by dividing both sides of Equation (1) by $G_\alpha(0,0,0)$ to yield $$F_\alpha(x,y,z) = 1 - \epsilon_\alpha(x,y,z) \tag{2}$$

The corrected gradient, $G_\alpha^c$, is given by $$G_\alpha^c = \frac{G'_\alpha(x,y,z)}{1 - \epsilon_\alpha(x,y,z)}, \tag{3}$$

The magnification factor $M_\alpha$, to be applied to each image column (line) to remap (displace) the pixel values to compensate for minification due to gradient nonlinearity is given by $$M_\alpha = \frac{1}{1 - \epsilon_\alpha(x,y,z)}. \tag{4}$$

Once the values $M_\alpha$ are calculated, an interpolation is performed from the distorted image pixel values to a corrected image using a suitable interpolation technique. A correction factor is determined for each pixel column due to the fact that the gradient nonuniformity, typically, varies from point to point.

Figure 2:
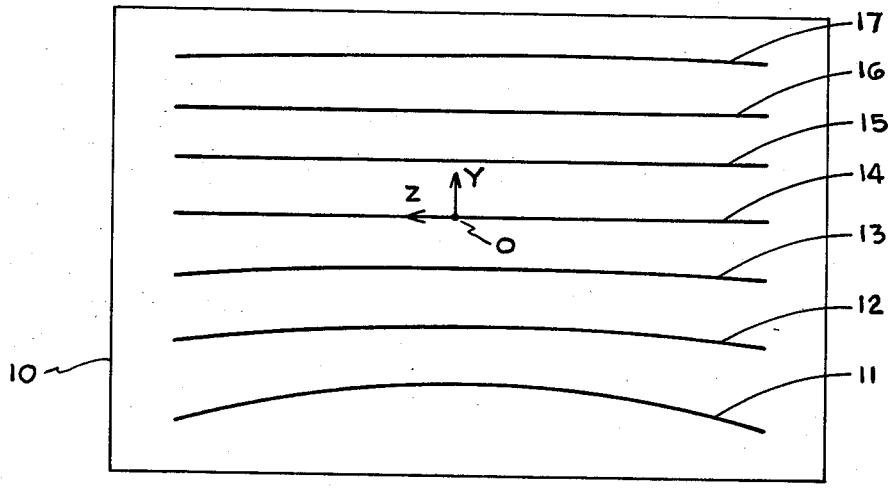
FIG. 2 depicts an image of a phantom similar to the one displayed in FIG. 1 but which has been corrected in accordance with the method of the invention.

Two- and three-dimensional corrections cay be performed by calculating the needed magnification factors $M_x$, $M_y$, and $M_z$ using the general method disclosed above. In practice, however, the correction factor $M_z$ may be sufficiently to close unity to ignore. In a two-dimensional transaxial sagital image, therefore, the correction need only be made in one dimension (the transverse one). Thus, for the distorted image of FIG. 1, a correction in the Y direction results in substantial improvement as may be appreciated by reference to FIG. 2 which depicts an image corrected in accordance with the method of the invention. The distortion in tube 11 of FIG. 2 is due to the intentional displacement of the phantom from x=0 to illustrate that a distortion in the X axis (similar to that in FIG. 1 in the Y-axis direction) is also extant. The presence of the distortion in the X direction is not unexpected since in the NMR system used to create the image data the $G_x$ and $G_y$ gradients are generated by identical coils which are rotated relative to one another by 90°. Gradient coils useful in generating the transverse magnetic field gradients $G_x$ and $G_y$ are disclosed and claimed in application Ser. No. 548,174, filed on Nov. 2, 1983. Application Ser. No. 529,431, filed on Sept. 6, 1983 discloses and claims a gradient coil for generating the longitudinal $G_z$ gradient. Both applications are assigned to the same assignee as the present invention and both are incorporated herein by reference.

The manner in which the distortion may be corrected in one dimension will now be described with specific reference to a correction due to nonuniformity in the $G_y$ gradient which accounts for the distortion in the Y-axis direction in FIG. 1. It will be recognized that corrections in the $G_x$ and $G_z$ directions are performed in substantially the same manner. Further corrections in all three directions can be performed sequentially. A one-dimensional correction in the transverse (either X or Y) direction is practical and will reduce most of the distortion, as evidenced in FIG. 2. In the one-dimensional correction it will be assumed that a simple magnificatiion in each vertical column (exemplified by vertical line 18, FIG. 1) of the image is sufficient. A typical image will have 128 or 256 such columns, although columns near the isocenter are typically free of significant distortion and may be left uncorrected.

The image of FIG. 1 was generated in an NMR system utilizing a transverse coil disclosed in afore-mentioned application Ser. No. 548,174 to generate the $G_y$ gradient. The spherical harmonic expansion for the gradient produced by this coil is known to be $$G_y \equiv \frac{\partial B_z}{\partial y} = 1 - 0.75906 \left( z^2 - \frac{4}{3} y^2 \right) /a^2. \tag{5}$$

Equation (5) has the same general form as Equation (2) such that $G_y$ is the actual gradient in normalized units and "a" is the gradient coil radius. Equation (5), accurate to third order, characterizes the degree of distortion in the $G_y$ gradient. The extent to which the coefficient 0.75906 (which is specific to the given coil) is non zero, indicates the degree of $G_y$ gradient dependence on z and y. If the dependence on y is ignored, then Equation (5) describes a simple magnification reduction which depends on z. In practice, this approximation is good near the Y axis at the edges of Z axis field of view. In Equation (8), described hereinafter, an average value $y_o$ is used to represent the dependence on y.

As indicated previously, the image is also distorted in the Z-axis direction to a degree dependent on the non-linearity in the $G_z$ gradient magnetic field. In the case of the Z-gradient coil disclosed in the afore-identified U.S. patent application Ser. No. 529,431 the nonuniformity is relatively small. Nonetheless, given that the spherical harmonic expansion for the $G_z$ gradient is known, a correction can be easily implemented. This correction is in addition to that in the $G_y$ gradient. The $G_z$ gradient can be defined (to the fifth order) as:

$$G_z = \frac{\partial B_z}{\partial y} = 1.0 - 0.4804(z/a)^4. \tag{6}$$

It is apparent from Equation (6) that the distortion in the Z-axis direction is independent of y. The corrected or displaced z coordinate or location of a pixel, $Z_c$, can be computed from $$Z_c \approx Z_r/[1.0-0.4804(Z_r/a)^4] \tag{7}$$

in which $Z_r$ is the actual (uncorrected) location.

The magnification factor, $M_y(z)$, to be applied to the image pixel data can now be determined from Equations (5) and (7) to be $$M_y(z) = \frac{1}{1 + \alpha\{(Z_r/a)^2/[1 + \beta(Z_r/a)^4]^2 - (y_o/a)^2\}}, \tag{8}$$

where $\alpha=0.75906$, $\beta=0.4804$, and $y_o$ is a constant chosen as an average value to represent y in Equation (5). The value of $y_o$ is empirically derived based on computer studies of $y_o$ values which result in the best image.

Figure 3:
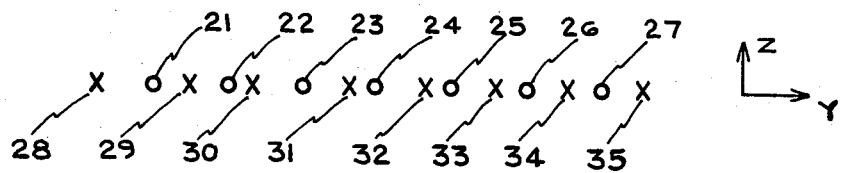
FIG. 3 is an exemplary illustration of the manner in which image distortion can be reduced by utilizing a suitable interpolation technique.

There remains to be considered the application of the magnification factor to correct the image. Referring to FIG. 3, it will be assumed that points 21-27 represent pixel values lying in the Y direction along line 18 (FIG. 1) in the distorted (minified) image. The problem of magnification (or for that matter minification, if the gradients increase rather than decrease in strength) is one of resampling due to the fact that points 21-27 in the image are physically closer than in the real object being imaged. Thus, given the known position of pixel points 21-27, it is desired to calculate (resample) a new set of points 28-35, for example, based on the magnification factor determined from Equation (8). If the distorted image has seven values (21-27 along line 18 and the magnification factor has been determined to be about 1.14, then the image must be resampled to contain eight points (28-35).

The position of the new points can be calculated using any one of the well-known interpolation techniques. Among the most elementary of these are pixel replication (also known as nearest-neighbor interpolation) and linear interpolation. These techniques are not very accurate and tend to blur the image. The most faithful form of interpolation is known as sinc interpolation (or frequency-space interpolation). A limitation of this technique in the present situation is that it is time consuming. A further disadvantage is that if Fast Fourier transform (FFT) techniques are to be used, the technique becomes limited to integer-value interpolation. A technique which is preferred in this instance is polynomial interpolation. The image in FIG. 2 was corrected using the polynomial interpolation technique with a magnification factor for each column of pixels (e.g., line 18, FIG. 1) calculated using equation (8).

Various orders of interpolation up to fourth order have been tried. It was found that negligble benefit was had beyond quadratic order. Coronal and sagittal images of the human torso have been corrected using the method of the invention with quadratic order interpolation. The corrected images do not exhibit interpolation noise which is detectable by the eye. For the particular coils utilized in the illustration example, the values of $\alpha=0.76$, $\beta=-0.48$, and $y_o=5$ cm. produced the best results.

Although the technique has been disclosed with reference to specific gradient coils, it is equally applicable to other gradient coils. It is beneficial, but not necessary, to know the spherical harmonic expansions (e.g., Equations (5) and (6) for the gradients in the direction of the desired image correction. Precise knowledge of the gradient fields permits more accurate corrections, since the values of $\alpha$ and $\beta$, for example, would be known to a greater accuracy. If the spherical expansions are not known, however, the magnetic field gradient can be characterized by performing actual measurements using a magnetic field-strength meter to measure the field at points of interest within the gradient coil. The measurements of gradient non-linearity at points near the edge of the field of view are normalized to those at the isocenter to determine the degree of aberration.

The method described hereinafter is useful in correcting images geometrically distorted (i.e., the pixel elements are displaced from the desired positions) due to gradient nonuniformity. However, it can be shown that, due to gradient nonuniformity, the pixel values (pixel amplitudes) are also distorted. That is, as the gradient decreases near the edges of the field of view, the image is not only minified, but gets "brighter" because the same proton mass (in the case of proton imaging) must be squeezed into fewer pixels.

The dependence of pixel value on the gradient may be seen by considering the Fourier transform of an NMR spin-echo signal, $S(t)$. By way of example, the signal in the y direction (ignoring spin spin ($T_2$) effects) is given by $$S(t) = \int \rho(y)e^{i(\gamma G_y y t)}dy \tag{9}$$

where
  $\rho(y)$ is nuclear spin density,
  i is the square root of $-1$, and
  $\gamma$ is the gyromagnetic ratio.

The Fourier transform, $S(\omega_y)$, of $S(t)$ is $$\hat{S}(\omega_y) = \int_{-\infty}^{\infty} \hat{S}(t)^{-i\omega_y t}dt \tag{10}$$

$$\hat{S}(\omega_y) = \frac{1}{\gamma G_y} \rho\left(\frac{\omega_y}{\gamma G_y}\right) \tag{11}$$

It is apparent from equation (11) that not only does the frequency coordinate in $S(\omega)$ scale with changing $G_y$, but also the amplitude is inversely proportional to $G_y$.

In the method described for the geometric correction, only a one-dimensional correction is applied (in a transverse (Y) direction). Thus, if the magnification factor at a position z is $M_y(z)$, as given by Equation (8), the pixel amplitude for that value of z must be divided by $M_y(z)$ to obtain the corrected pixel value.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed:

1. A method for correcting distortion in NMR images composed of a multi-dimensional array of pixel elements, said distortion arising from magnetic field gradient nonuniformity in at least one dimension of the array, said distortion being manifested by displacement of pixel elements relative to desired positions thereof by an amount related to the degree of gradient nonuniformity, said method comprising the steps:

defining the expected degree of pixel displacement due to the magnetic field nonuniformity in at least one dimension of the pixel array; and applying a geometric correction to predetermined ones of said displaced pixel elements as determined by the expected degree of pixel displacement to minimize pixel displacement from the desired position in a corrected image.

2. The method of claim 1 wherein said step of defining the pixel displacement comprises the step of determining the magnetic field nonuniformity in at least one dimension of the pixel array.

3. The method of claim 2 wherein said step of determining comprises measuring the magnetic field nonuniformity.

4. The method of claim 2 wherein said step of defining comprises determining the spherical harmonic expansion for the non-uniform magnetic field gradient.

5. The method of claim 4 wherein the spherical harmonic expansion is of the general form $$F_\alpha(x,y,z) = 1 - \epsilon_\alpha(x,y,z),$$

where $F_\alpha(x,y,z)$ is the normalized non-uniform magnetic field gradient, and $\epsilon_\alpha(x,y,z)$ is the normalized error term by which the gradient at $(x,y,z)$ departs from the gradient at the isocenter, and $\alpha$ is one of x, y, and z.

6. The method of claim 5 wherein said step of applying a geometric correction to said displaced pixel elements comprises determining a correction factor, $M_\alpha$, for predetermined ones of the displaced pixel elements, the correction factor being of the general form $$M_\alpha = \frac{1}{1 - \epsilon_\alpha(x,y,z)}.$$

7. The method of claim 6 wherein said step of applying a geometric correction further includes the step of determining the desired positions for predetermined ones of the displaced pixel elements by interpolation of the displaced pixel positions.

8. The method of claim 7 wherein said step of interpolating comprises applying polynomial interpolation.

9. The method of claim 2 wherein said step of applying a geometric correction further includes the step of determining the values for pixel elements at desired locations by interpolation, 10. The method of claim 9 wherein said step of interpolating comprises applying polynomial interpolation.

11. The method of claim 1, 2, 3, 4, 5, 6, 7, or 8 further comprising the step of applying an amplitude correction to predetermined ones of said displaced pixel elements based on the degree of nonuniformity in the magnetic field gradient.

12. The method of claim 11 wherein said step of applying an amplitude correction comprises determining a correction factor, $M_\alpha$, for predetermined ones of the displaced pixel elements, the correction factor being of the general form $$M_\alpha = \frac{1}{1 - \epsilon_\alpha(x,y,z)},$$

where $\epsilon_\alpha(x,y,z)$ is the normalized error term by which the gradient at $(x,y,z)$ departs from the gradient at the isocenter, and $\alpha$ is one of x, y, and z.

13. The method of claim 12 wherein said step of applying an amplitude correction comprises determining the desired pixel amplitude by dividing the displaced amplitude of predetermined ones of the displaced pixel elements by the correction factor $M_\alpha$.

* * * * *